United States Patent
Cattani et al.

(10) Patent No.: US 10,118,819 B2
(45) Date of Patent: *Nov. 6, 2018

(54) SYSTEM FOR DRIVING AN ARRAY OF MEMS STRUCTURES AND CORRESPONDING DRIVING METHOD

(71) Applicant: STMICROELECTRONICS S.R.L., Agrate Brianza (IT)

(72) Inventors: Alberto Cattani, Cislago (IT); Alessandro Gasparini, Cusano Milanino (IT); Federico Guanziroli, Lentate Sul Seveso (IT); Pierangelo Confalonieri, Caponago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/410,394

(22) Filed: Jan. 19, 2017

(65) Prior Publication Data

US 2017/0129773 A1    May 11, 2017

Related U.S. Application Data

(63) Continuation of application No. 14/675,230, filed on Mar. 31, 2015, now Pat. No. 9,604,842.

(30) Foreign Application Priority Data

May 27, 2014    (IT) .............................. TO2014A0422

(51) Int. Cl.
*B81B 7/00*        (2006.01)
*B81B 3/00*        (2006.01)
(Continued)

(52) U.S. Cl.
CPC ................ *B81B 7/008* (2013.01); *B81B 3/00* (2013.01); *B81B 7/04* (2013.01); *H04R 3/007* (2013.01);
(Continued)

(58) Field of Classification Search
CPC ........ B81B 2201/0257; B81B 2207/03; B81B 7/008; H04R 2201/003; H04R 3/007; H04R 3/12
See application file for complete search history.

(56) References Cited

U.S. PATENT DOCUMENTS 9,604,842 B2 *    3/2017    Cattani ................... B81B 7/008
2002/0101769 A1 *    8/2002    Garverick .............. G02B 6/266
365/200

(Continued)

FOREIGN PATENT DOCUMENTS

EP            1 640 956 A2    3/2006

*Primary Examiner* — Muhammad S Islam
(74) *Attorney, Agent, or Firm* — Seed Intellectual Property Law Group LLP

(57) ABSTRACT

A system for driving a MEMS array having a number of MEMS structures, each defining at least one row terminal and one column terminal, envisages: a number of row driving stages, each for supplying row-biasing signals to the row terminal of each MEMS structure associated to a respective row; a number of column driving stages, each for supplying column-biasing signals to the column terminal of each MEMS structure associated to a respective column; and a control unit, for supplying row-address signals to the row driving stages for generation of the row-biasing signals and for supplying column-address signals to the column driving stages for generation of the column-biasing signals. The control unit further supplies row-deactivation and/or column-deactivation signals to one or more of the row and (Continued)

column driving stages, for causing deactivation of one or more rows and/or columns of the MEMS array.

20 Claims, 10 Drawing Sheets

(51) Int. Cl.
    *B81B 7/04*     (2006.01)
    *H04R 3/00*     (2006.01)
    *H04R 3/12*     (2006.01)
    *H04R 19/00*     (2006.01)

(52) U.S. Cl.
    CPC ............. *H04R 3/12* (2013.01); *H05K 999/99* (2013.01); *B81B 2201/0257* (2013.01); *B81B 2207/03* (2013.01); *B81B 2207/053* (2013.01); *H04R 19/005* (2013.01); *H04R 2201/003* (2013.01)

(56) References Cited

U.S. PATENT DOCUMENTS

| | | |
|---|---|---|
| 2005/0023656 A1 | 2/2005 | Leedy |
| 2006/0049826 A1 | 3/2006 | Daneman et al. |
| 2006/0066594 A1 | 3/2006 | Tyger |
| 2009/0236677 A1 | 9/2009 | Warren |
| 2009/0244077 A1* | 10/2009 | Sato .................. G09G 5/39 345/531 |
| 2010/0108479 A1* | 5/2010 | Ebeling ............. H01H 59/0009 200/181 |
| 2011/0164009 A1 | 7/2011 | Van Lier et al. |
| 2012/0256237 A1 | 10/2012 | Lakamraju et al. |
| 2013/0207746 A1 | 8/2013 | Gupta |
| 2014/0062619 A1 | 3/2014 | Montanya Silvestre et al. |
| 2014/0210866 A1* | 7/2014 | Seo ..................... G09G 3/3466 345/690 |

* cited by examiner

SYSTEM FOR DRIVING AN ARRAY OF MEMS STRUCTURES AND CORRESPONDING DRIVING METHOD

BACKGROUND

Technical Field

The present disclosure relates to a system for driving an array of MEMS (Micro-ElectroMechanical System) structures and to a corresponding driving method.

Description of the Related Art

It is known that a MEMS structure in general comprises at least one mobile element (for example a membrane, or diaphragm) capacitively coupled to at least one fixed element.

Application of a potential difference between said mobile and fixed elements generates a movement of the mobile element with respect to the fixed element, enabled by an appropriate arrangement of elastic elements; in particular, in the case of a speaker, the movement is such as to generate a sound wave.

Likewise, an external stress, such as to move the mobile element with respect to the fixed element, generates a potential difference between the same fixed and mobile elements which may be detected to obtain an indication of the value of the external stress.

From the circuit standpoint, a MEMS structure may thus be represented by at least one capacitor defining a capacitance between two terminals, one connected to the mobile element and the other connected to the fixed element.

Recently, applications have been proposed that envisage the use of arrays of MEMS structures (in brief, MEMS arrays), organized in rows and columns; for example, in the audio field, realization of a speaker device has been proposed, constituted by an array of MEMS structures.

In this case, each MEMS structure defines an elementary unit, also known as pixel, comprising a membrane, which is able to move towards one or more fixed armatures; application of an appropriate potential difference between the membrane and the fixed armatures enables movement of the membrane itself into contact with the armatures, with consequent generation of elementary sound waves. The superposition of the elementary sound waves generated by the MEMS structures of the array generates the resulting sound signal produced by the MEMS speaker.

The manufacturing of MEMS structures arranged in an array, in some applications use free access to an external environment (for example, audio applications for reception or emission of sound waves) and may envisage the absence of surface passivation; in other words, the resulting MEMS array may be directly exposed to air, without the presence of protection structures.

It follows that the MEMS array is more readily subject to the penetration of contaminating particles or entities, which may create failure, for example consisting of undesired current paths between the terminals of one or more of the MEMS structures of the array, rendering them no longer functional or reliable and thus unusable.

In general, the risk may arise of short-circuits which may activate a high current path, with the danger of damage to the MEMS structures (for example, to the corresponding metallizations) and to the driving systems electrically coupled to the MEMS array.

By way of example, FIG. 1 is a schematic illustration of a MEMS array 1, including a plurality of MEMS structures 2, set in rows and columns; each MEMS structure 2 is identified by the respective number of row and column to which it is associated: for example, the MEMS structure '21' is associated to the second row and to the first column.

In particular, each MEMS structure 2, in the example represented, has a first terminal 2a, for example associated to a corresponding membrane (not illustrated herein) connected to a respective column and a second terminal 2b, for example associated to a corresponding fixed armature (not illustrated herein) connected to a respective row; the MEMS structure 2 defines a capacitor between the first and second terminals 2a, 2b.

It will be evident, however, for a person skilled in the field, that the MEMS structure 2 may differ from what has been illustrated schematically, for example in that it presents one or more further terminals, in this case coupled to respective rows and/or columns. It is further evident that, alternatively, the first terminal 2a of the MEMS structure 2 may be connected to a respective row and the second terminal 2b to a respective column of the MEMS array 1.

For each row i (where i is an integer ranging from 1 to n, n being the total number of rows), the MEMS array 1 includes a row driving stage 4, having an input 4a, which receives (for example, from a control unit of an external device) a respective row-address signal Ri and an output 4b, which supplies a corresponding row-biasing signal DRi, having an appropriate value that is a function of the row-address signal Ri. The output 4b is connected to the second terminal 2b of the MEMS structures 2 connected to the respective row.

In particular, the row driving stages 4 are equal in number to the rows of the MEMS array 1 and are thus configured so as to bias at one or more appropriate biasing voltages, according to the possible operating conditions, the second terminal 2b of all the MEMS structures 2 connected to the respective row.

Likewise, for each column j (where j is an integer ranging from 1 to m, m being the total number of columns, which may possibly be equal to the number of rows), the MEMS array 1 includes a column driving stage 6, having an input 6a, which receives a respective column-address signal Cj and an output 6b, which supplies a corresponding column-biasing signal DCj, having an appropriate value that is a function of the column-address signal Cj. The output 6b is connected to the first terminal 2a of the MEMS structures 2 connected to the respective column.

In particular, the column driving stages 6 are equal in number to the columns of the MEMS array 1 and are thus configured so as to bias to one or more appropriate biasing voltages, according to the possible operating conditions, the first terminal 2a of all the MEMS structures 2 connected to the respective column.

Consequently, the aforesaid row-address and column-address signals Ri, Cj define potential differences of a desired value between the first and second terminals 2a, 2b of the MEMS structures 2 of the MEMS array 1.

The row and column driving stages 4, 6 are designed so as to take into account the total of the capacitive loads defined on the respective row and/or column by the associated MEMS structures 2 and further possible intrinsic resistances in the paths required for reaching the same MEMS structures 2.

The present Applicant has realized that the architecture described for the MEMS array 1 has some drawbacks.

In particular, in the case where a failure arises, for example owing to onset of a short-circuit path due to infiltration of impurities, regarding even just one of the MEMS structures 2, the entire MEMS array 1 may prove unusable, or in any case no longer able to operate as expected.

Evidently, this drawback, in addition to representing a problem from the standpoint of the operating costs, may not be accepted in given applications in which a certain level of tolerance to failures is required.

BRIEF SUMMARY

One embodiment of the present disclosure is directed to a system to drive a MEMS array, the system including a plurality of row driving stages coupled to the MEMS array, the MEMS array having a plurality of MEMS structures that each have a row terminal and a column terminal, each of the plurality of row driving stages being configured to supply row-biasing signals to the row terminal of each MEMS structure associated with a respective row and a plurality of column driving stages coupled to the MEMS array, each of the plurality of column driving stages being configured to supply column-biasing signals to the column terminal of each MEMS structure associated with a respective column. The system also including a control unit configured to supply row-address signals to said row driving stages to generate the row-biasing signals and to supply column-address signals to said column driving stages to generate the column-biasing signals, the control unit being configured to further supply row-deactivation and column-deactivation signals to one or more of said row and column driving stages to cause deactivation of one or more rows and columns of said MEMS array.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
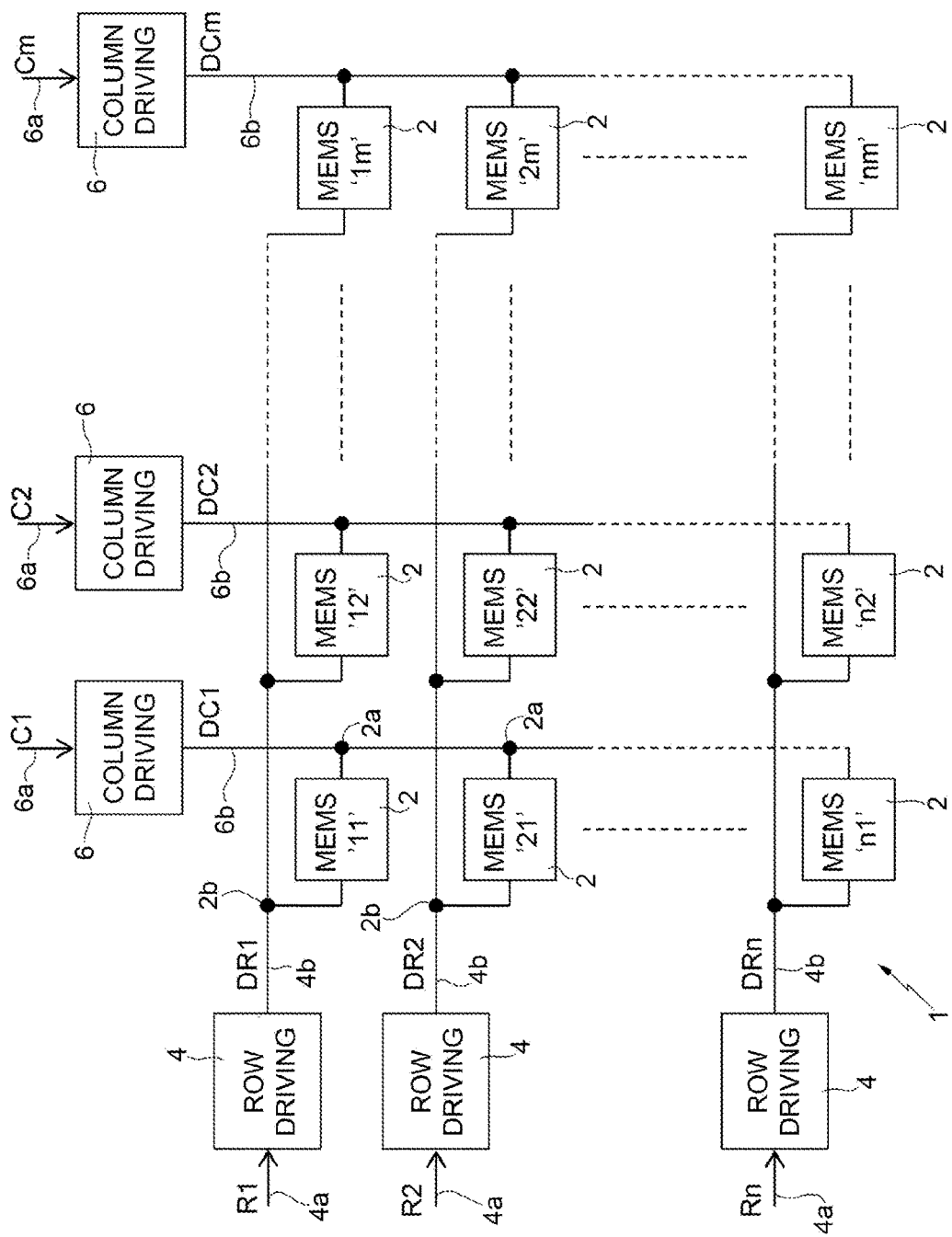
FIG. 1 shows an overall block diagram of a MEMS array of a known type and of an associated driving system.
Figure 2:
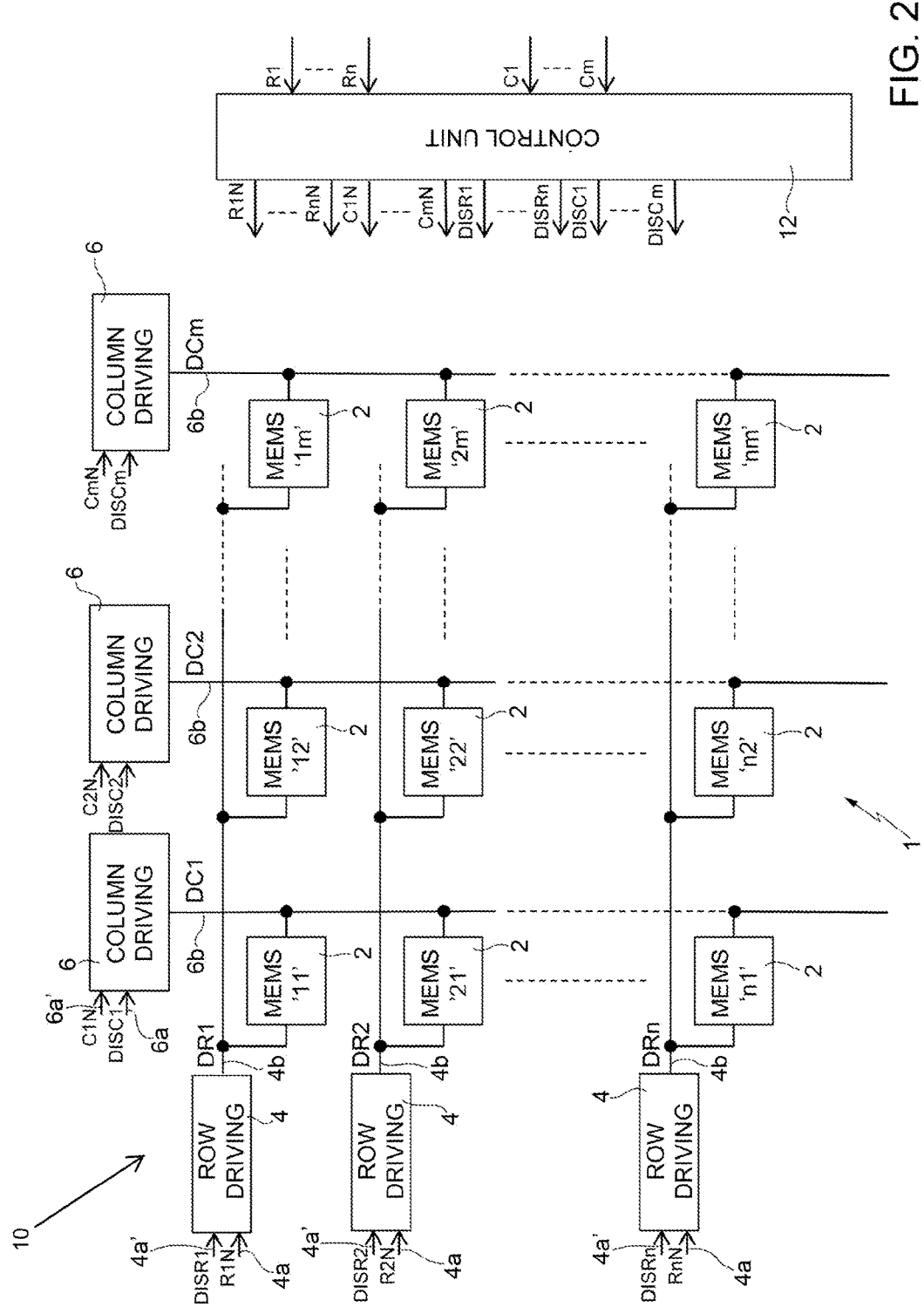
FIG. 2 shows an overall block diagram of a MEMS array and of an associated driving system, according to one aspect of the present solution.

With reference to FIG. 2 (where same references are used to designate elements corresponding to ones already described previously), a driving system for a MEMS array 1, designated as a whole by 10, comprises, according to one aspect of the present solution, a control unit 12, for example including appropriate combinational and sequential logic circuits, or an FPGA (Field-Programmable Gate Array), or another computing and processing unit of a known type; the control unit 12 is operatively coupled to the MEMS array 1.

In particular, the control unit 12 receives at input, for example from an external electronic device, first row-address and column-address signals Ri, Cj (generated as a function of a desired operating condition of the MEMS array 1) and generates at output, for the respective row and column driving stages 4, 6, second row-address signal RiN and column-address signal CjN, which are a function, in at least some operating conditions, of the first row-address and column-address signals Ri, Cj.

The row and column driving stages 4, 6 generate the respective row-biasing signal DRi and column-biasing signal DCj as a function of the second row-address signal RiN and column-address signal CjN, respectively.

According to one aspect of the present solution, the control unit 12 is configured to further generate at output row-deactivation and column-deactivation signals DISRi, DISCj for the respective row and column driving stages 4, 6, which in this case include further respective inputs 4a', 6a'.

As will be discussed in detail hereinafter, the aforesaid row-deactivation and column-deactivation signals DISRi, DISCj make it possible to deactivate, or not render operative, the respective addressed MEMS structures 2, in such a way as to prevent any possible failure that might arise in the same MEMS structures 2 from jeopardizing operation of the entire MEMS array 1.

Figure 3:
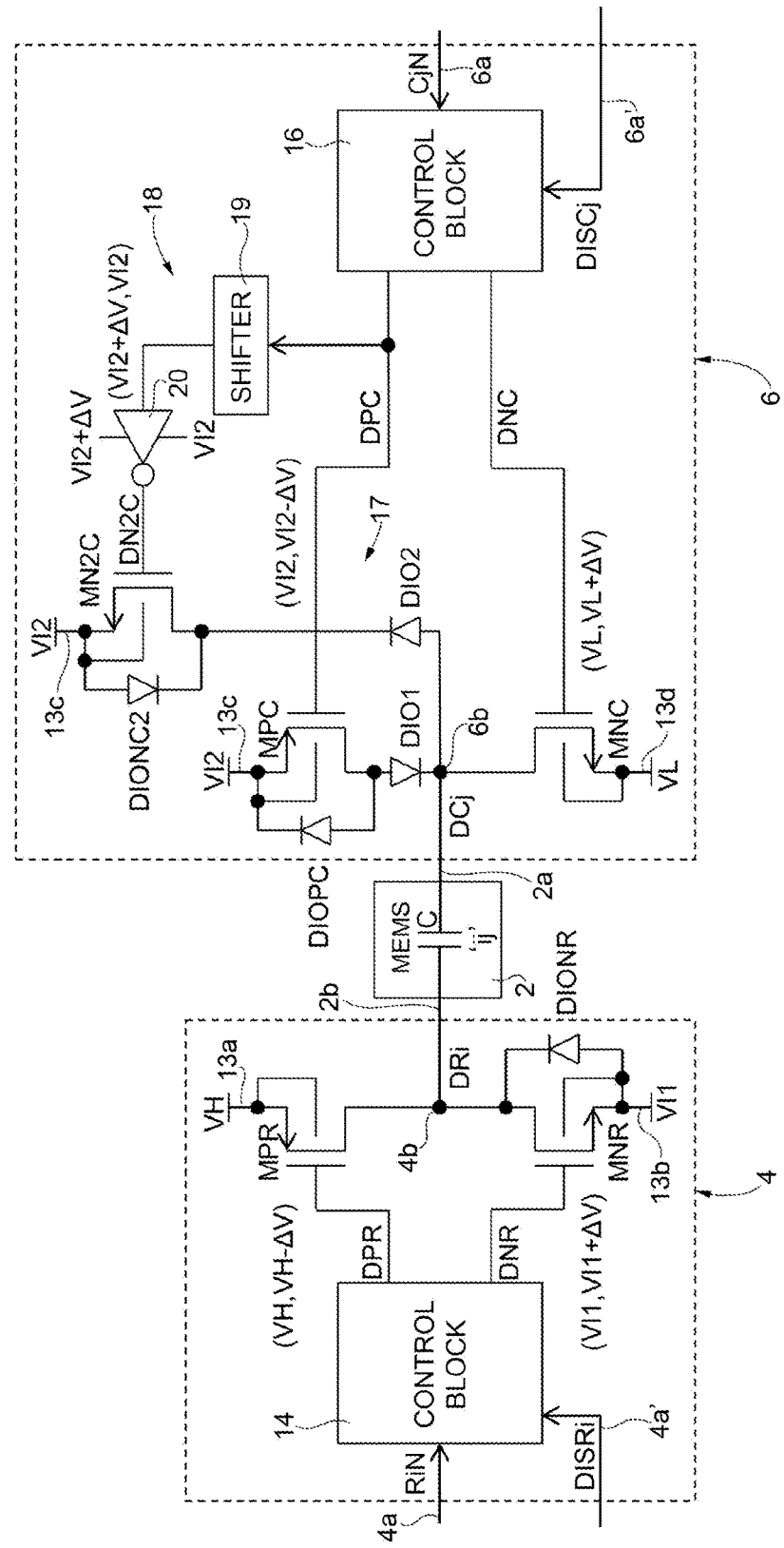
FIG. 3 shows a circuit diagram of a row driving stage and a column driving stage associated to a MEMS structure of the MEMS array of FIG. 2, according to a first embodiment of the present solution.

With reference to FIG. 3, the configuration is now described, by way of example, of a row driving stage 4 and a column driving stage 6 associated to a MEMS structure 2 of the MEMS array 1 (for example, the generic MEMS structure 'ij').

In this example, the row driving stage 4 is configured to generate a row-biasing signal DRi that may have a first biasing value, corresponding to a high supply voltage VH, or alternatively a second biasing value, corresponding to a first intermediate supply voltage VI1; likewise, the column driving stage 6 is configured to generate a column-biasing signal DCj that may have a respective first biasing value, corresponding to a second intermediate supply voltage VI2, or alternatively a respective second biasing value, corresponding to a low supply voltage VL.

In particular, the high supply voltage VH has the highest voltage value, the low supply voltage VL has the lowest voltage value, the first intermediate supply voltage VD is intermediate between the high and low supply voltages VH, VL, or even equal to one of the two voltages, and the second intermediate supply voltage VI2 has the same voltage limits as the first intermediate supply voltage VI1, but may assume a value higher than, equal to, or lower than the same first intermediate supply voltage VI1, according to the operating conditions.

In general, the biasing voltages used are particularly high, even higher than 100 V; the low supply voltage VL possibly coincides with a reference voltage, or ground GND, of the circuit.

The row driving stage 4 comprises: a high-side transistor MPR, in particular of a P-channel MOS type, having its source terminal connected to a first supply terminal 13a, which receives the high supply voltage VH, its drain terminal connected to the output 4b and its gate terminal that receives a first row-control voltage DPR; and a low-side transistor MNR, in particular of an N-channel MOS type, having its source terminal connected to a second supply terminal 13b, which receives the first intermediate supply voltage VI1, its drain terminal connected to the output 4b and its gate terminal that receives a second row-control voltage DNR (in FIG. 3 the parasitic diode DIONR present between the body terminal, connected to the source terminal and the drain terminal of the low-side transistor MNR, is further illustrated in so far as its presence is relevant for the following discussion).

The high-side transistor MPR and the low-side transistor MNR are appropriately made and sized to withstand the high voltages present in the row driving stage 4.

The row driving stage 4 further comprises a control block 14, which is connected to the input 4a and receives the respective row-address signal RiN, at low voltage, for example 1.2 V and is configured so as to generate, as a function of the row-address signal RiN, the first and second row-control voltages DPR, DNR.

In particular, the first row-control voltage DPR may alternatively assume the values VH and VH−ΔV, where ΔV is a low-voltage deviation, for example equal to 3.3 V. The second row-control voltage DNR may alternatively assume the values VI1 and VI1+ΔV, assuming for simplicity that the same deviation ΔV is used.

The aforesaid voltage values, shifted and not overlapping, enable effective control of switching-on and switching-off of the high-side transistor MPR and low-side transistor MNR and further prevent the occurrence of a possible condition of cross-conduction between the same transistors.

In a substantially similar way, the column driving stage 6 comprises: a respective high-side transistor MPC, in particular of a P-channel MOS type, having its source terminal connected to a third supply terminal 13c, which receives the second intermediate supply voltage VI2, its drain terminal connected to the output 6b (in the embodiment illustrated in FIG. 3 through interposition of a protection diode DIO1, the function of which will be described hereinafter, having its anode connected to the aforesaid drain terminal and its cathode connected to the aforesaid output 6b) and its gate terminal that receives a first column-control voltage DPC; and a respective low-side transistor MNC, in particular of an N-channel MOS type, having its source terminal connected to a fourth supply terminal 13d, which receives the low supply voltage VL, its drain terminal connected to the output 6b and its gate terminal that receives a second column-control voltage DNC.

In FIG. 3 the parasitic diode DIOPC present between the body terminal, connected to the source terminal and the drain terminal of the high-side transistor MPC, is further illustrated in so far as its presence is relevant for the ensuing discussion.

The high-side transistor MPC and low-side transistor MNC are appropriately made and sized to withstand the high voltages present in the column driving stage 6.

The column driving stage 6 further comprises a respective control block 16, which is connected to input 6a and receives the respective column-address signal Cj, at low voltage, for example 1.2 V and is configured so as to generate, as a function of the column-address signal Cj, the first and second column-control voltages DPC, DNC.

In particular, the first column-control voltage DPC may alternatively assume the values VI2 and VI2−ΔV, considering, for sake of simplicity, once again the same deviation ΔV. The second column-control voltage DNC may alternatively assume the values VL and VL+ΔV.

Also in this case, the aforesaid voltage values, shifted and not overlapping, enable effective control of switching-on and switching-off of the high-side transistor MPC and low-side transistor MNC and further prevent occurrence of a possible cross-conduction condition between the same transistors.

In a normal operation condition, the voltage difference between the first and second terminals 2a, 2b of the MEMS structure 2 (defined by the value of the row-biasing and column-biasing signals DRi, DCj), which is variable as a function of the values of the supply voltages and of the row-address and column-address signals Ri, Cj, determines a desired response of the MEMS structure 2 (for example, a movement of a corresponding membrane, not illustrated), here schematically represented by the corresponding capacitor C correlated thereto.

According to a particular aspect of the present solution, the row driving stage 4 and the column driving stage 6 further receive on their respective inputs 4a', 6a' the corresponding row-deactivation signal DISRi and column-deactivation signal DISCj, respectively, supplied by the control unit 12.

As a function of the value of these deactivation signals, the row and column driving stages 4, 6 are configured to "deactivate" the corresponding row and column (and consequently the associated MEMS structures 2) and in particular to bring into a floating or high-impedance condition, the so-called "tri-state", the corresponding outputs 4b, 6b (and consequently the first and second terminals 2a, 2b of the associated MEMS structures 2), irrespective of the value of the row-address signal RiN and column-address signal CjN.

Thus, any possible failure of one or more of the associated MEMS structures 2, for example due to short-circuits between the corresponding terminals 2a, 2b, are isolated within the row driving stage or column driving stage 4, 6 and do not affect the entire MEMS array 1, jeopardizing operation thereof.

In detail, following upon reception of the respective row-deactivation signal DISRi and column-deactivation signal DISCj, the control blocks 14, 16 control simultaneous switching-off of the high-side transistors and low-side transistors MPR, MNR and MPC, MNC by means of an appropriate value of the corresponding row-control and column-control voltages DPR, DNR and DPC, DNC (in other words, the gate terminals of all the MOS transistors are forced to the respective supply voltages so as to turn them off).

In this operating condition, the presence of the protection diode DIO1 prevents creation of a potentially destructive high-current path between the first and second intermediate supply voltages VI1, VI2 through the diodes DIONR and DIOPC, in the case where the first intermediate supply voltage VI1 is greater than the second intermediate supply voltage VI2. In fact, in this particular operating condition, the protection diode DIO1 opposes the flow of this current.

The presence alone of the protection diode DIO1 might, however, not be sufficient to guarantee, in all possible operating conditions (during normal operation), the selected driving of the MEMS structure 2.

In particular, in the case where the high-side transistor MPC were switched on and the low-side transistor MNC were switched off and further the second terminal 2b were switched from the value VI1 to the value VH, the first terminal 2a would instantaneously reach voltages higher than the value VI2; thus, the first terminal 2a might not, however, return to the value VI2 and thus guarantee the selected operation of the MEMS structure 2 in so far as the protection diode DIO1 would in this case block passage of charges towards the second intermediate supply VI2 through the high-side transistor MPC.

To overcome this drawback, in the embodiment illustrated in FIG. 3, the column driving stage 6 further comprises a recirculation circuit branch 17, which is connected between the output 6b and the third supply terminal 13c that receives the second intermediate supply VI2, and is constituted by the series of a recirculation diode DIO2 and a recirculation transistor MN2C, in particular of an N-channel MOS type (of which the parasitic diode DIONC2 is further illustrated).

The recirculation transistor MN2C has its gate terminal that is driven by a control signal DN2C in phase with the high-side transistor MPC, in other words so as to be switched on, or switched off, as the high-side transistor MPC is in turn switched on, or switched off.

For this purpose, the column driving stage 6 further comprises: a control circuit branch 18, including a voltage-shifter block 19, which receives at input the first column-control voltage DPC having values (VI2, VI2−ΔV) and is configured to generate a shifted voltage having values (VI2+ΔV, VI2); and an inverter block 20, which receives the aforesaid shifted voltage and generates the control signal DN2C having values (VI2, VI2+ΔV).

The control circuit branch 18 thus operates, in the operating condition previously highlighted, to enable passage of charges towards the third supply terminal 13c (and proper operation of the MEMS structure 2) through the recirculation circuit branch 17.

For voltage values equal to or less than VI2 on the first terminal 2a, the aforesaid recirculation circuit branch 17 does not introduce any variation, given that the recirculation diode DIO2 in this case opposes the passage of electric current.

Also in the tri-state condition, the recirculation circuit branch 17 does not introduce further problems in so far as in this case the first terminal 2a is isolated, owing to the presence of the series of the two diodes in back-to-back configuration DIO2 and DIONC2.

Sizing of the recirculation transistor MN2C and of the recirculation diode DIO2 will in any case be compatible with the requirements of speed of switching response of the second terminal 2b of the MEMS structure 2.

In a way that will emerge clearly to a person skilled in the field, an alternative and altogether equivalent embodiment is possible (not illustrated in the figures and not described in detail so as not to burden the discussion any further), which envisages providing the recirculation and control circuits 17, 18 (having the same function discussed previously) in the row driving stage 4.

This solution envisages connecting the protection diode in series to the low-side transistor MNR and back to back with respect to the parasitic diode DIONR, and connecting the recirculation circuit branch 17 (in this case, constituted by the series of a recirculation diode and a recirculation transistor of a P-channel MOS type) between the second terminal 2b and the second supply terminal 13b; also in this case, the control circuit branch 18 may further be provided, configured to drive the recirculation transistor, in phase this time with the low-side transistor MNR, starting from the second row-control voltage DNR.

The person skilled in the field may evaluate the convenience, for example in terms of area occupation (considering that the first solution envisages providing additional circuit components within the column driving stage 6, whereas the second solution refers to the row driving stage 4) and opting for one solution or the other.

Figure 4:
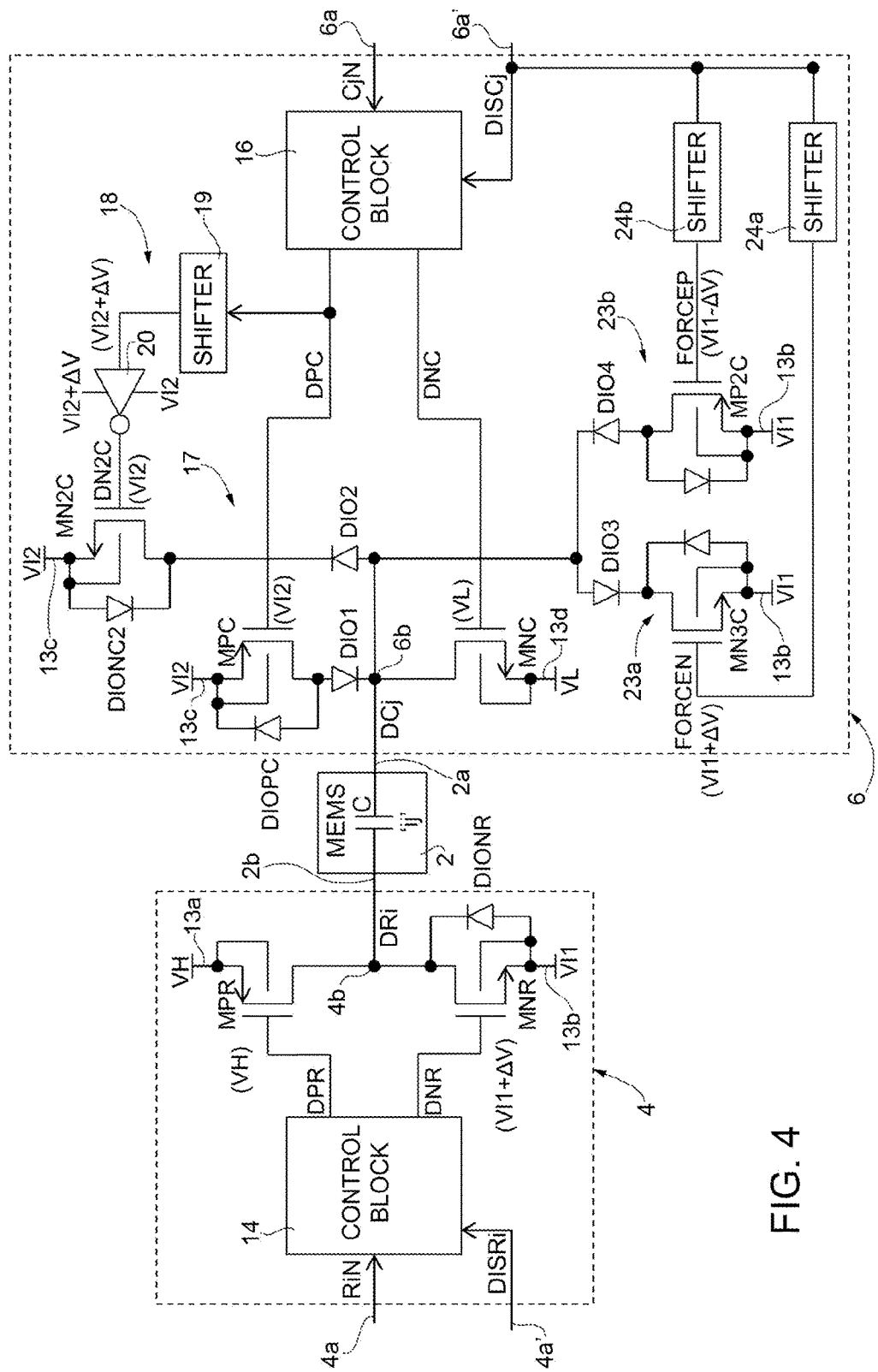
FIG. 4 shows a circuit diagram of a row driving stage and of a column driving stage associated to a MEMS structure of the MEMS array of FIG. 2, according to a second embodiment of the present solution.

Another aspect of the present solution envisages a further circuit modification, in the example illustrated in FIG. 4 referred to the column driving stage 6; once again, what is now described may, however, be alternatively and likewise applied to the row driving stage 4, in the case where it proves advantageous to provide the additional circuit components in the row driving stage 4.

This aspect of the present solution derives from the realization, by the present Applicant, that in the high-impedance tri-state operating condition, the first and second terminals 2a, 2b of the MEMS structure 2 reach voltages that may not be determined, for example as a result of leakage and may potentially stimulate the MEMS structure 2 to yield unforeseeable responses. For instance, in the audio field undesirable sound phenomena, the so-called "glitches", could be generated.

To overcome this potential problem, the solution illustrated in FIG. 4 envisages implementing a further condition of deactivation of the MEMS structure 2 (as an alternative or in addition to the tri-state condition, for use in different operating situations), once again determined by the row-deactivation and column-deactivation signals DISRi, DISCj, in this case by imposing a zero difference of potential across the MEMS structure 2 (between the terminals 2a and 2b).

For this purpose, a first deactivation-circuit branch 23a and a second deactivation-circuit branch 23b are introduced, which are connected between the output 6b and the second supply terminal 13b that receives the first intermediate supply voltage VI1 (it should thus be noted that in this case the column driving stage 6 envisages electrical connection to three different supply terminals, set at voltages VL, VI1 and VI2, respectively).

The first deactivation-circuit branch 23a is constituted by the series of a deactivation diode DIO3 and of a deactivation transistor MN3C, of an N-channel MOSFET type; the deactivation diode DIO3 has its anode connected to the output 6b and its cathode connected to the deactivation transistor MN3C.

The second deactivation-circuit branch 23b is in turn constituted by the series of a respective deactivation diode DIO4 and of a deactivation transistor MP2C, of a P-channel MOSFET type; the deactivation diode DIO4 has its cathode connected to the output 6b and its anode connected to the deactivation transistor MP2C.

With the row-deactivation and column-deactivation signals DISRi and DISCj active, the deactivation transistors MN3C, MP2C are switched on by the voltages on their gate terminals (generated on the basis of the column-deactivation signal DISCj via respective voltage-shifter blocks 24a, 24b, and in particular having values VI1+ΔV and VI1−ΔV); switching-on of the deactivation transistors MN3C, MP2C forces the value of the output 6b and thus of the first terminal 2a of the MEMS structure 2, to the first intermediate supply voltage VI1.

Also the second terminal 2b of the MEMS structure 2 is, in this operating condition, set at the first intermediate supply voltage VI1, through the low-side transistor MNR (which is in this case kept on, due to activation of the row-deactivation signal DISRi, the second row-control signal DNR being in fact set at the value VI1+ΔV).

It is to be noted that the presence of the two deactivation-circuit branches 23a, 23b guarantees that forcing of the first terminal 2a to the first intermediate supply voltage VI1 is effective irrespective of the starting value of the first same terminal 2a (higher or lower than the first intermediate supply voltage VI1).

In summary, with the row-deactivation and column-deactivation signals DISRi, DISCj active, the control blocks 14, 16 force the MOS transistors MPR, MPC, MN2C, MNC, into a switching-off condition while they force the MOS transistors MNR, MN3C and MP2C into a switching-on condition. FIG. 4 shows the values of the driving voltages on the corresponding gate terminals during the deactivation condition.

In the normal operating condition, all the MOS transistors are driven as a function of the values assumed by the row-address and column-address signals Ri, Cj, with the exclusion of the MOS transistors MN3C and MP2C, which are forced into an off condition (with the gate terminals set at the first intermediate supply voltage VI1 via the respective voltage-shifter blocks 24a, 24b) so as not to cause current leakages.

The size of the deactivation transistors MP2C and MN3C may thus advantageously be small in so far as they conduct only in the deactivation condition.

According to a further aspect of the present solution, the deactivation condition previously discussed may be implemented also to force the state of the row and column driving stages 4, 6 of the entire MEMS array 1 into the so-called "power-down" mode (i.e., with a minimum consumption by the driving network).

In particular, use of the solution discussed with reference to FIG. 4 enables a deterministic return to the "power-up" (or reactivation) condition, preventing possible undesirable phenomena, for example "glitches", in audio applications.

A further aspect of the present solution envisages the possibility of implementing a mechanism of detection and identification of any possible failure, which might arise in the MEMS array 1, for example due to creation of short-circuit current paths in one or more of the MEMS structures 2.

Figure 5:
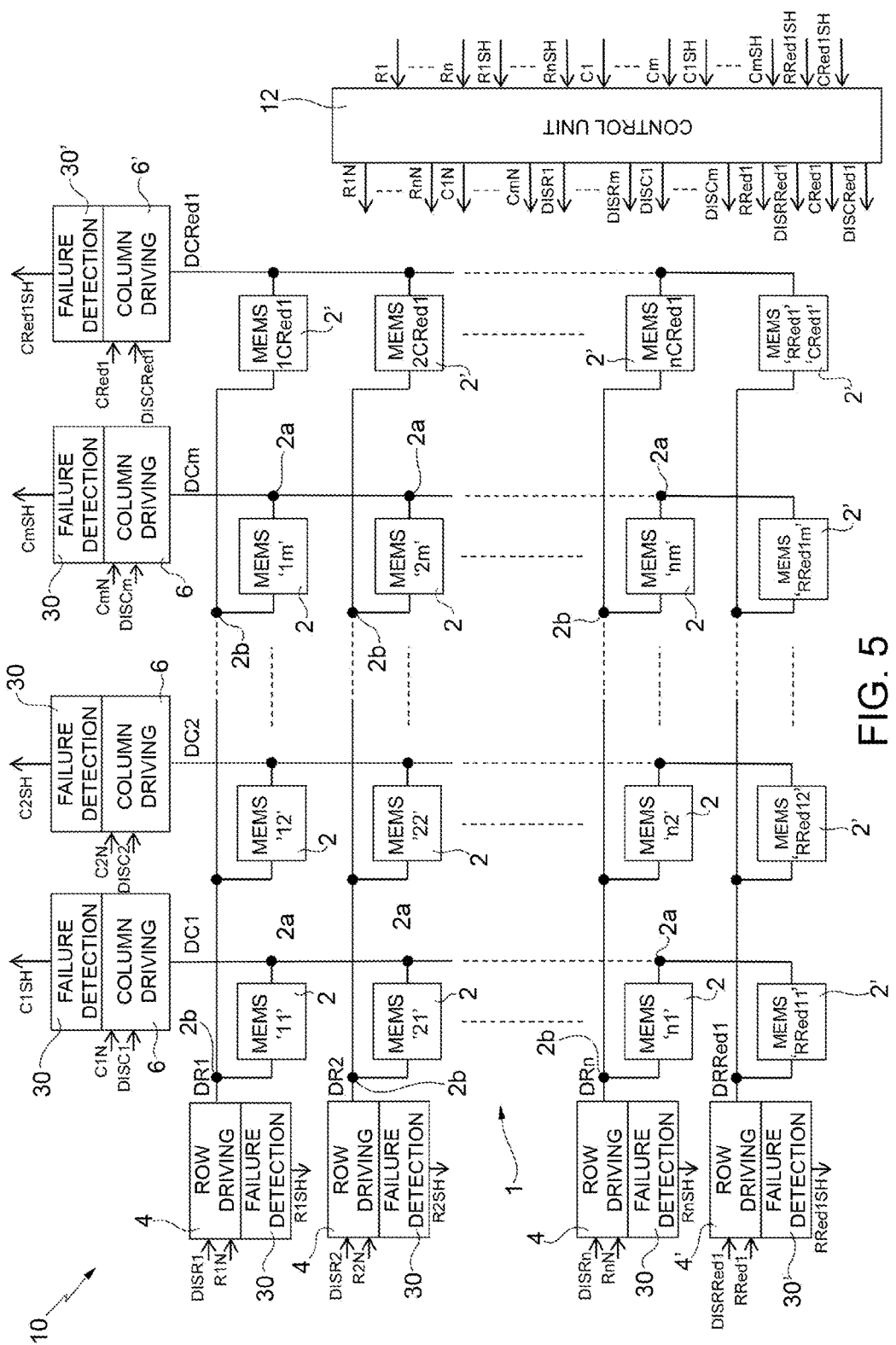
FIG. 5 shows an overall block diagram of a MEMS array and of an associated driving system, according to a further aspect of the present solution.

In the embodiment illustrated in FIG. 5, for this purpose a failure-detection stage is provided for each row driving stage 4 and column driving stage 6; the failure-detection stage, designated as a whole by 30, is configured so as to detect excessive passage of current in the associated row driving stage 4 or column driving stage 6.

In a way not described in detail but that will be evident for a person skilled in the field, the aforesaid failure-detection stage 30 may comprise a comparator block that compares the voltage across the MOS transistor (the high-side or low-side transistor) that is each time switched on with an appropriate threshold voltage and generates a failure-detection signal (or short-circuit signal) in the case where it detects that the same voltage is higher than the threshold for a time longer than a given time interval. This condition may indeed indicate corruption of the capacitor defined by the corresponding MEMS structure 2, for example as a result of formation of a passage of current in parallel thereto.

Each error-detection stage 30 thus generates an error-detection signal, designated by R1SH-RnSH for the rows of the MEMS array 1 and by C1SH-CmSH for the columns of the same MEMS array 1; error-detection signals R1SH-RnSH, C1SH-CmSH are received at input by the control unit 12.

For instance, in the hypothesis that the MEMS structure '22' were affected by a short-circuit, the error-detection signals R2SH and C2SH would be activated.

The control unit 12, in the absence of active warnings of error detection, is configured to send to the respective outputs RiN and CjN the unaltered values of the row-address and column-address signals Ri and Cj received at input, as well as to leave inactive all the deactivation signals DISRi and DISCj on the respective outputs, so that the MEMS array 1 operates in the normal operating condition.

Following upon an error warning, the control unit 12 will, instead, deactivate the rows and columns concerned (in the case of the example, the row '2' and the column '2') via the corresponding row-deactivation and column-deactivation signals DISRi, DISCj (in the example, DISR2 and DISC2).

As discussed previously, the corresponding row and column driving stages 4, 6 will alternatively go into the tri-state condition, according to the embodiment discussed with reference to FIG. 3, or else will force on the terminals 2a and 2b of the MEMS structure 2 the same intermediate voltage, according to the embodiment discussed with reference to FIG. 4.

Subsequently, it is simply possible to leave inactive the rows and columns judged as failed, signaling the event to the external device (here not illustrated) that provides the row-address and column-address signals Ri, Cj, which may take required measures.

Alternatively, a further aspect of the present solution envisages the possibility of implementing a redundancy mechanism, for replacement of the corrupted rows and/or of the corrupted columns (which, as such, have been disabled according to the mechanisms described previously).

In the embodiment described in FIG. 5, the MEMS array 1 comprises for this purpose one or more redundancy rows, constituted by respective redundant MEMS structures 2' driven by a corresponding row-biasing signal DRRed1 generated by a corresponding redundancy-row driving stage 4'; FIG. 5 illustrates by way of example just one redundancy row with the corresponding MEMS structures designated by 'Rred1j' (in a way not illustrated, one or more further redundancy rows 'Rred2j', 'Rred3j', and so forth, could, however, be present).

Furthermore, in a similar manner, the MEMS array 1 may comprise one or more redundancy columns, constituted by respective redundant MEMS structures 2' driven by a corresponding column-biasing signal DCRed1 generated by a corresponding redundancy-column driving stage 6'. FIG. 5 illustrates by way of example just one redundancy column, designated by 'iCred1', with the corresponding MEMS structures (in a way not illustrated, one or more further redundancy columns 'iCred2', 'iCred3' and so forth, could, however, also be present).

A respective redundancy-row driving stage, designated by 4', is in any case associated to each redundancy row; the redundancy-row driving stage receives from the control unit 12 a respective redundancy-row address signal Rred and a respective redundancy-deactivation signal DISRRed. Likewise, associated to each redundancy column is a respective redundancy-column driving stage, designated by 6', which receives from the control unit 12 a respective redundancy-column address signal Cred and a respective redundancy-deactivation signal DISCRed.

Furthermore, in the embodiment illustrated in FIG. 5, a failure-detection stage is also associated to the redundancy-row and redundancy-column driving stages 4', 6; the failure-detection stage, designated as a whole by 30', supplies a respective failure-detection signal RRedSH and CRedSH.

In general, the control unit 12, in the absence of error warnings, keeps the redundancy rows and columns deactivated; the redundancy mechanism may envisage replacement, by the control unit 12, of a desired number of rows and columns judged as non-functioning in the MEMS array 1 with respective redundancy rows and columns.

For instance, in the case of error in the MEMS structure ij, the control unit 12 may control inhibition of the row i and column j of the MEMS array 1 and then enable a redundancy row and a redundancy column forcing on them the same row-address and column-address signals Ri, Cj envisaged for the disabled row and column.

The position of the redundancy rows and columns within the MEMS array 1 may be any; for instance, in the case of a number of redundancy rows, these may be distributed within the MEMS array 1 with regular spacing so as to be selectable on the basis of a criterion of closeness to the row, or rows, to be replaced.

In the case where it were required to maintain the original sequence of positions, the control unit 12 may use redundancy by changing any address of the rows and columns that are not corrupted: for example, if the row '30' of a 32-row MEMS array were to fail, the control unit 12 could assign to the generated row-address signal R31N the value of the row-address signal R30, to the generated row-address signal R32N the value of the signal R31 and to the redundancy row the row-address signal R32 so as to maintain the sequence and contiguity originally envisaged.

Figure 6:
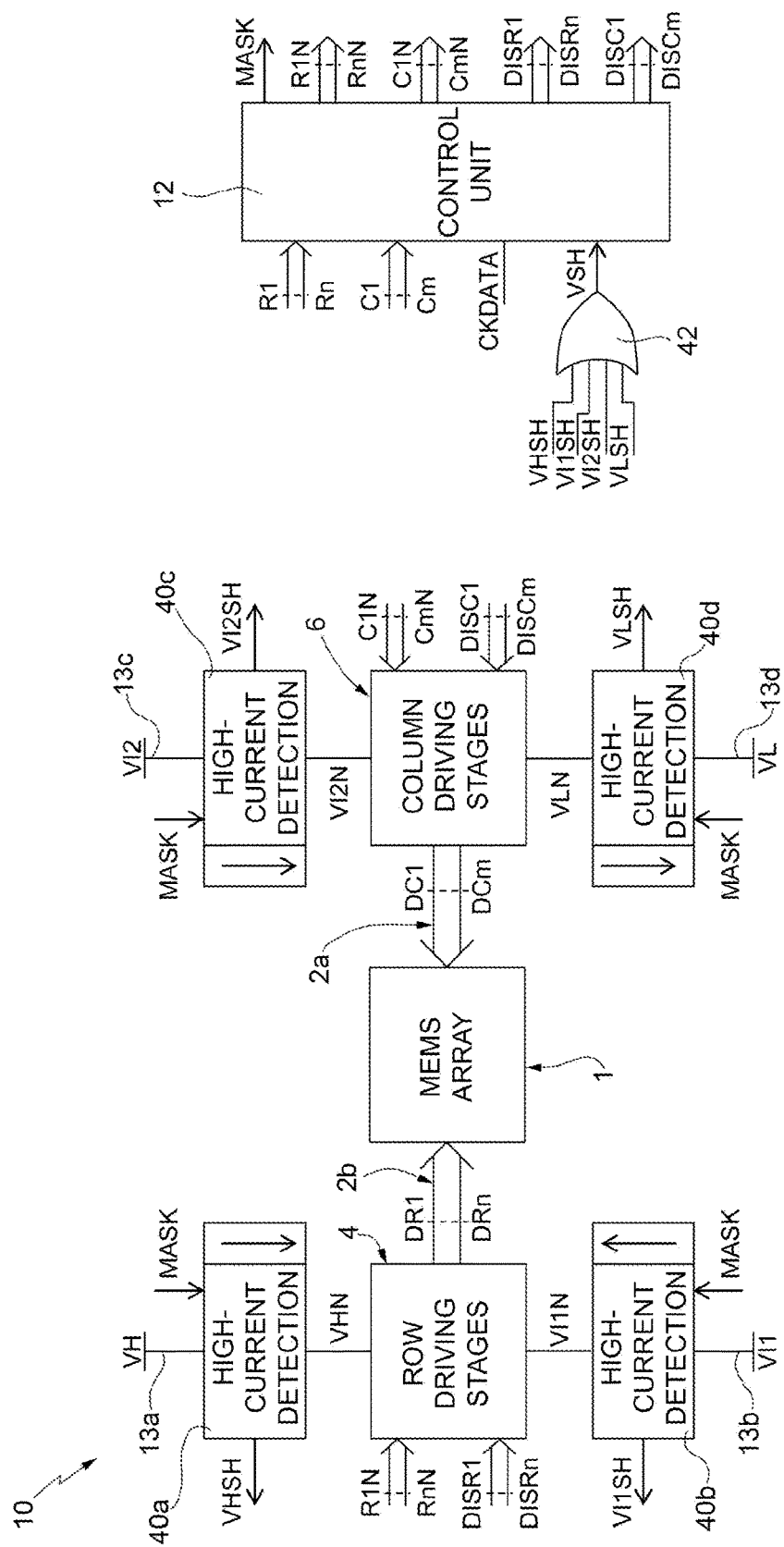
FIG. 6 shows an overall block diagram of a MEMS array and of an associated driving system, according to yet a further embodiment of the present solution.

There now follows a description, with reference to FIG. 6, of a different embodiment of the mechanism of detection and identification of any possible failure that may arise in the MEMS array 1, for example on account of high currents due to short-circuit current paths, or in general to undesirable resistive paths.

In FIG. 6, the MEMS array 1 and the corresponding row and column driving stages 4, 6 are illustrated schematically and are not discussed again in detail. Furthermore, for reasons of simplicity of representation, the redundancy rows and columns and the corresponding driving stages are not illustrated, even though they may of course be present.

In this embodiment, the driving system 10, instead of envisaging a failure-detection stage for each row driving stage 4 and column driving stage 6 (as in the solution discussed previously), comprises a reduced number of high-current detection stages associated to the MEMS array 1, each configured to detect the presence of a high current representing a short-circuit in the electrical path towards a respective one of the supply terminals 13a, 13b, 13c or 13d, irrespective of the existing driving condition.

In particular, in the embodiment illustrated in FIG. 6, four high-current detection stages are envisaged; namely: a first high-current detection stage 40a, electrically connected along the electrical path towards the first supply terminal 13a and the high supply voltage VH, set between the row driving stages 4 and the same first supply terminal 13a; a second high-current detection stage 40b, electrically connected along the electrical path towards the second supply terminal 13b and the first intermediate supply voltage VI1, set between the row driving stages 4 and the same second supply terminal 13b; a third high-current detection stage 40c, electrically connected along the electrical path towards the third supply terminal 13b and the second intermediate supply voltage VI2, set between the column driving stages 6 and the same third supply terminal 13c; and a fourth high-current detection stage 40d, electrically connected along the electrical path towards the fourth supply terminal 13d and the low supply voltage VL, set between the column driving stages 6 and the same fourth supply terminal 13d.

In particular, according to one aspect of the present solution, the first, second and third high-current detection stages 40a, 40b, 40c are configured to: detect a current of a high value, which is absorbed respectively by the high supply voltage VH, by the first intermediate supply voltage VI1 and by the second intermediate supply voltage VI2, i.e., a current in the direction indicated by the arrows in FIG. 6; and provide, respectively, a first high-current detection signal VHSH, a second high-current detection signal VI1SH and a third high-current detection signal VI2SH. Instead, the fourth high-current detection stage 40d is configured to detect a current of a high value flowing in the direction of the low supply voltage VL once again indicated by the arrow in the same FIG. 6 and for providing a fourth high-current detection signal VLSH.

The present Applicant has indeed realized that the above directions of detection of the current are sufficient to ensure correct detection for any driving combination and further both in the case where the first intermediate supply voltage VI1 is lower than the second intermediate supply voltage VI2 (VI1<VI2) and in the opposite case (VI2<VI1).

In this embodiment, the control unit 12 has an input that is designed to receive a high-current detection signal VSH, which is the result of an OR logic combination of the first, second, third and fourth high-current detection signals VHSH, VI1SH, VI2SH and VLSH (it is to be noted that in this case the inputs designed to receive the error-detection signals R1SH-RnSH, C1SH-CmSH are instead not present).

The driving system 10 comprises for this purpose an OR logic gate 42, which receives at input the aforesaid first, second, third and fourth high-current detection signals VHSH, VI1SH, VI2SH and VLSH and supplies at output the high-current detection signal VSH.

Furthermore, for reasons that will be set forth in detail hereinafter, the control unit 12 receives a data-clock signal CKDATA and generates a masking signal MASK, which is supplied to each of the high-current detection stages 40a-40d.

In general, the control unit 12, via the high-current detection signal VSH, is able to detect the presence of a current representing the short-circuit of at least one of the MEMS structures 2 of the MEMS array 1 and activate appropriate actions for isolating the failure and possibly remedying it, for example by activation of redundancy structures.

In particular, according to one aspect of the present solution, the control unit 12 is configured so as to implement a procedure for identifying the MEMS structure 2, or MEMS structures 2, responsible for the high current detected (in other words, for identifying the position of the failure, or failures, within the MEMS array 1).

Figure 7:
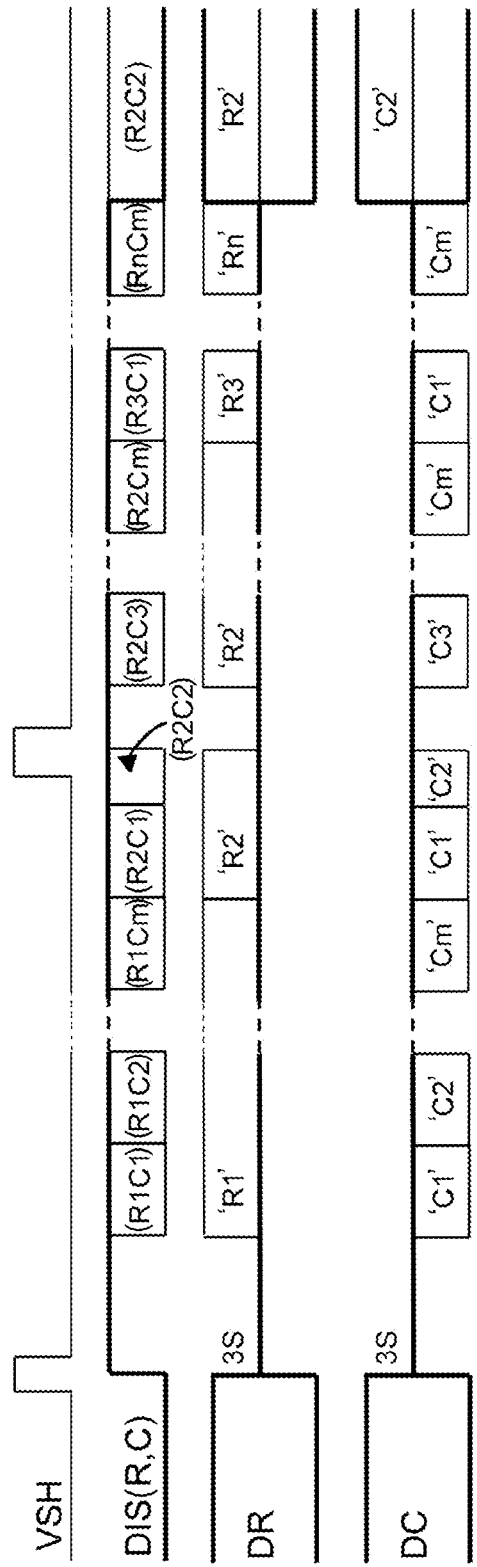
FIG. 7 shows a timing diagram regarding operation of the driving system of the array of FIG. 6.

For this purpose, with reference also to the timing diagram of FIG. 7, when the high-current detection signal VSH notifies occurrence of a short-circuit (for example, by switching to the high value), the control unit 12 first disables all the rows and columns of MEMS array 1, by activating the respective row-deactivation and column-deactivation signals, DISR1-DISRn, DISC1-DISCm for the respective row and column driving stages 4, 6 (designated in FIG. 7 as a whole by DIS (R,C)), waiting for the short-circuit to be identified.

For instance, the outputs of the row and column driving stages 4, 6 may be brought into the tri-state condition (as described in detail previously).

Consequently, the short-circuit current path or paths is/are thus deactivated and the high-current detection signal VSH returns to the low value.

Next, through the second row-address signals R1N-RnN and column-address signals C1N-CmN, generated by the control unit 12 as a function of the first row-address signals R1-Rn and column-address signals C1-Cm received at input, the control unit 12 implements a sequence useful for seeking the specific row and column at the intersection of which the failed MEMS structure 2 is located.

For this purpose, the control unit 12 causes first the connection of the row '1' to the high supply voltage VH (via the respective row driving stage 4) and then in succession the connection of the columns from '1' to 'm' to the low supply voltage VL (via the respective column driving stages 6), each time bringing the column previously activated back into the tri-state condition; the control unit 12 then determines activation of the second row (bringing the first row back into the tri-state condition) and subsequently activation in sequence of the various columns from '1' to 'm', continuing in the same way, one row/column pair at a time, in the sequence that will stimulate all the possible combinations.

Likewise, the control unit 12 may force connection of each row to the high supply voltage VH and in succession connection of the columns to the second intermediate supply voltage VI2; or else force connection of each row to the second intermediate supply voltage VI2 and in succession connection of the columns to the first intermediate supply voltage VI1; or else force connection of each row to the first intermediate supply voltage VI1 and in succession connection of the columns to the first intermediate supply voltage VI2; or else again force connection of each row to the first intermediate supply voltage VI1 and in succession connection of the columns to the low supply voltage VL. The use of these different driving conditions may possibly stress to a lesser extent any short-circuit path that may be present (given the use of voltages of lower value).

In any case, at the moment when a row/column combination determines detection of a short-circuit (the high-current detection signal VSH returns to the high value), the detection unit 12 determines the position of the failure on the basis of the row and column that are at that moment active (it is to be recalled that all the other rows and columns are instead kept deactivated).

In the example illustrated in FIG. 7, the combination of row 'R2' and column 'C2' is found to be responsible for the short-circuit; the row/column pair is disabled and will also be kept disabled thereafter and may possibly be replaced with a respective redundancy row and redundancy column (as previously discussed in detail).

Search for failures thus proceeds, repeating the sequence up to exhaustion of the possible combinations, possibly disabling further combinations of rows and columns at which failures, for example short-circuits, have been identified.

As indicated in the plot of FIG. 7, at the end of the procedure, the control unit 12 brings back all the rows and columns into the active mode, driving them into normal operation (as a function of the input-addressing values), except for the rows and columns on which failures have been identified, which are kept deactivated.

Figure 8:
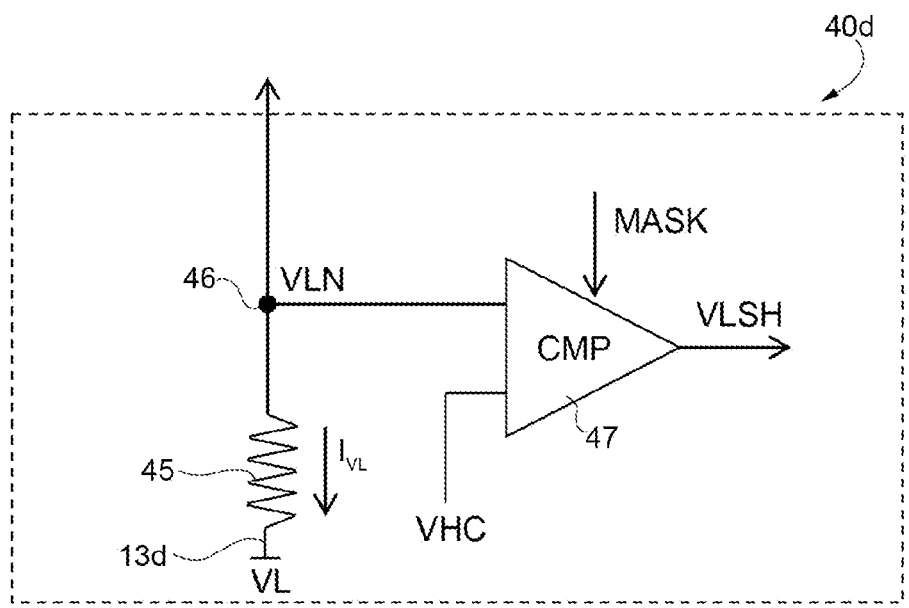
FIG. 8 shows the circuit implementation of a current-detection stage in the driving system of the array of FIG. 6.

With reference to FIG. 8, a possible embodiment of the high-current detection stages 40a-40d is now described; by way of example, the fourth current-detection stage 40d, which for simplicity will be referred to simply as 'current-detection stage' is described in detail. It will in any case be evident to the person skilled in the field how to modify the circuit described to provide the other current-detection stages 40a-40c.

The current-detection stage 40d comprises, set in series with respect to the corresponding supply path, a detection resistance 45, having a low value, of the order of a few ohms (for example, 5Ω).

The detection resistance 45 is, in the example, connected between the fourth supply terminal 13d and a detection node 46, which is in turn to be connected to the column driving stages 6 and supplies the respective supply voltage, here designated by VLN (likewise, this resistance may be connected to the row driving stages 4, according to the position of the detection stage and according to the corresponding supply path to which it is set in series).

A detection voltage VLN, present on the detection node 46, is indicative of a current IVL that traverses the detection resistance 45 (as mentioned previously, this voltage further represents the supply voltage for all the column driving stages 6, in this embodiment).

In particular, in normal operating conditions, no currents stably flow through the aforesaid detection resistance 45; instead, in the presence of a short-circuit, a considerable current (for example, in the range between 1 mA and 500 mA, up to values of some amps) arises.

The current-detection stage 40d further comprises a comparator block 47, which has a first comparison input connected to the detection node 46 and a second comparison input, which receives a threshold voltage VHC, of an appropriate value, that is considered as indicating a failure of the MEMS structure 2.

The comparator block 47 further has an output, which supplies a comparison signal, namely, the high-current detection signal VLSH, the value of which, for example high, signals the existence of a failure, for example of a short-circuit, in the path towards the supply (in this case, towards the low supply voltage VL).

According to one aspect of the present solution, the comparator block 47 also has an input, which receives the masking signal MASK, generated by the control unit 12.

The present Applicant has in fact realized that, during switching of the row or column addresses, current peaks may arise that could cause false short-circuit detection by the high-current detection stages 40a-40d.

The presence of the masking signal MASK has thus the role of preventing any false warnings during switching.

Figure 9:
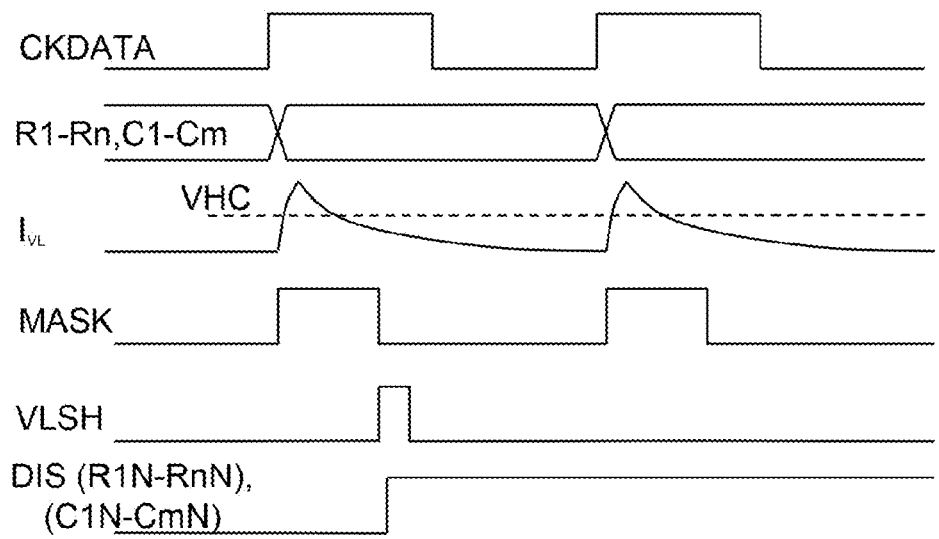
FIG. 9 shows a timing diagram regarding operation of the current-detection stage of FIG. 8.

As illustrated in the timing diagram of FIG. 9, masking signal MASK is generated by the control unit 12 at one or more switchings of the row-address signals R1-Rn and column-address signals C1-Cm, determined by the data-clock signal CKDATA (for example, at a rising edge of said data-clock signal CKDATA).

The value of the masking signal MASK is kept active (for example, in the high state) by the control unit 12 for a time longer than the time in which the switching current may cause, on the detection node 46, a detection voltage VLN higher than the threshold voltage VHC and, when high, masks the output of the comparator block 47, inhibiting its possible outcome.

Furthermore, the aforesaid masking signal MASK resets the comparator block 47 itself in such a way that upon its release (i.e., when the masking signal MASK itself returns to the low value) the comparator block 47 may switch rapidly in the presence of a failure, guaranteeing a high detection speed and thus reducing the risks of a tardy inhibition of the row and column that drive the MEMS structure 2 into a short-circuit condition.

As illustrated in FIG. 9, in the presence of a short-circuit, the comparison signal VLSH switches to the high value as soon as the masking signal MASK returns to the low value; in an evident way, in the case where a short-circuit were not present, the same comparison signal VLSH would not change its value.

FIG. 9 further shows that the control unit 12 disables all the rows and columns (by the row-deactivation and column-deactivation signals DISR1-DISRn, DISC1-DISCm), waiting for the short-circuit to be identified, which causes the comparison signal VLSH to drop to the low value given that the current path is thus deactivated.

It is emphasized that, since there are no currents traversing the detection resistance 45 in a stable way, the detection resistance 45 itself does not significantly affect the consumption levels or even the static values; it may modify the switching transient, but not significantly and in any case its effect may be taken into consideration in the design of the associated row and column driving stages 4, 6.

In the case where the data-clock signal CKDATA is not known, or is not supplied in another way to the control unit 12, a further aspect of the present solution envisages that the driving system 10 includes a data-clock detection stage, connected to the control unit 12 (or implemented within the same control unit 12) for supplying the aforesaid data-clock signal CKDATA.

Figure 10:
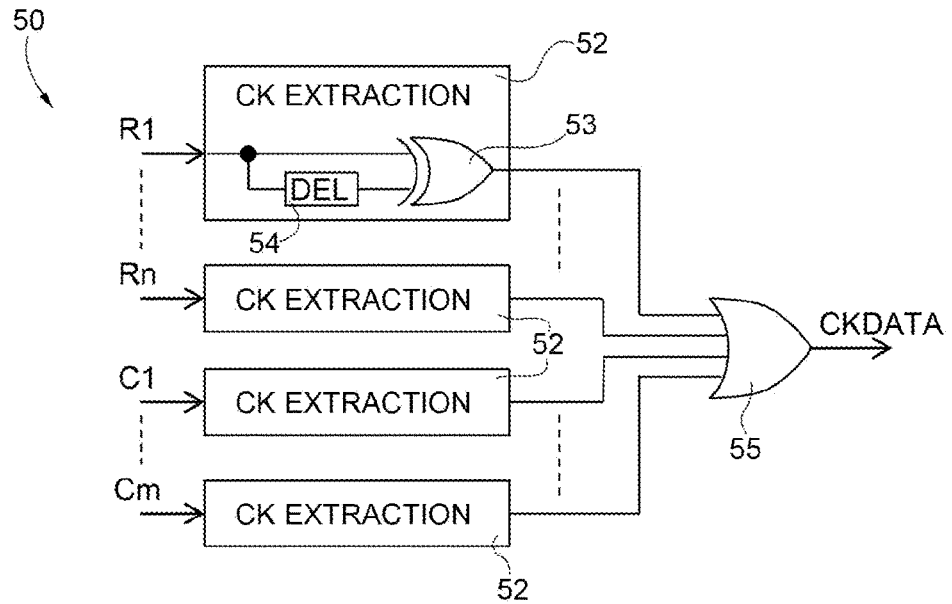
FIG. 10 shows the circuit implementation of a timing stage in the driving system of the array of FIG. 6.

As illustrated in FIG. 10, the data-clock detection stage, designated by 50, comprises an extraction block 52 for each row-address signal R1-Rn and column-address signal C1-Cm, which receives at input the same row-address signal R1-Rn and column-address signal C1-Cm.

The extraction block 52 produces a pulse at each variation of its input; in the example represented in FIG. 10, the extraction block 52 includes an EXOR gate 53 having a first input, which receives the respective row-address signal R1-Rn or column-address signal C1-Cm, a second input, which receives the same address signal delayed by a delay unit 54 and an output, which represents the output of the corresponding extraction block 52.

The data-clock detection stage 50 further comprises an OR logic gate 55, which receives at input the outputs of the various extraction blocks 52 and generates at output the data-clock signal CKDATA for the control unit 12.

A further aspect of the present solution envisages the possibility of adjusting the threshold of detection of malfunctioning, in particular of the short-circuit or of the undesirable resistive path.

The present Applicant has in fact realized that it is not always possible, at the design stage, to know the effective value, for example of the short-circuit current that renders a MEMS structure 2 unusable. The risk could thus exist, if a threshold that is too low were to be chosen, of deactivating functioning MEMS structures and, if a threshold that is too high were to be chosen, of not disabling MEMS structures that are in actual fact non-functioning.

Figure 11:
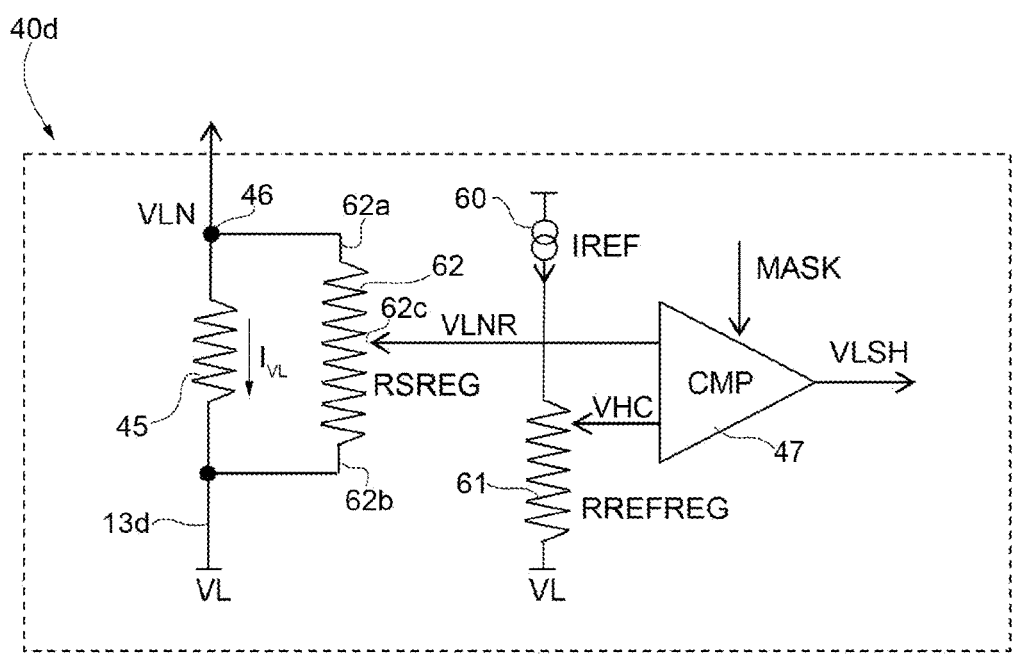
FIG. 11 shows the circuit implementation of the current-detection stage in the driving system of the array of FIG. 6, according to a further embodiment.

With reference to FIG. 11, purely by way of example, an alternative embodiment is thus described for the current-detection stage 40d, once again with reference to the path towards the low supply voltage VL. In FIG. 11, the same reference numbers are used to designate elements that have already been described previously.

In particular, the detection stage 40d comprises in this case a current-reference generator 60, coupled to a reference variable resistor 61, which has an adjustable value of resistance and is matched to the value of the detection resistor 45, for generation of the threshold voltage VHC for the comparator block 47, which has in this case an adjustable value (advantageously, the threshold may thus be chosen in a different way for different applications and is thus programmable).

Furthermore, the detection stage 40d comprises, connected in parallel to the detection resistor 45, an adjustment variable resistor 62; the adjustment variable resistor 62 has a first terminal 62a and a second terminal 62b connected to corresponding terminals of the detection resistor 45 and a central terminal 62c, which has an adjustable position.

The first comparison input of the comparator block 47 is in this case connected to the adjustment variable resistor 62 for receiving a comparison voltage VLNR, having an adjustable value (lower than the value of the detection voltage VLN), set at the central terminal 62c.

The above solution is advantageous in so far as it enables a dual possibility of adjustment, with small steps over a wide range and at a contained cost.

In particular, the presence of the adjustment variable resistor 62 advantageously enables a reduction of the value of the comparison voltage VLNR with respect to the value of the detection voltage VLN, in such a way that the value of the reference variable resistor 61 may be accordingly reduced (facilitating its production with a value matched to the value of the detection resistor 45).

Furthermore, advantageously, the value of resistance of the adjustment variable resistor 62 itself is such as not to cause a sensible variation of the detection current IVL in the detection resistance 45.

From what has been described herein, the advantages that the system and the method according to the present solution afford will emerge clearly.

In general, it is again emphasized that the solution proposed enables deactivation of a portion of a MEMS array 1 that is recognized as being malfunctioning so as not to hinder the use of the remaining, functioning, part; the present solution further enables replacement of the non-functioning part by using redundancy structures.

In particular, the solution enables exclusion of rows and/or columns of the MEMS array 1 affected by a short-circuit that is associated to one or more of the corresponding MEMS structures 2 after the failure has been detected and also identified.

Furthermore, it is possible to deactivate the entire MEMS array 1 and/or bring the same MEMS array 1 into a secure state during a power-down condition, further ensuring a deterministic return to normal operation (power-up).

The solution described with reference to FIG. 6 enables detection of the presence of one or more failed MEMS structures 2 with an expenditure in terms of area and a consumption that are markedly reduced (as compared to the solution described with reference to FIG. 5). The low detection time further reduces to a minimum the risk of the entire system becoming unusable following upon damage resulting from failure. The high sensitivity of detection enables detection of low currents and the ample possibility of adjustment enables a choice of the threshold values to be used for detection resulting from the experience acquired in the field.

The aforesaid advantages prove particularly important for applications in the audio field, for instance for providing an array of MEMS speakers.

Finally, it is clear that modifications and variations may be made to what has been described and illustrated herein, without thereby departing from the scope of the present disclosure.

For instance, the present solution may also be used in the case where the MEMS structure 2 has a different configuration.

In particular, one or more of the MEMS structures 2 may have a so-called differential (or dual) structure, having a mobile membrane between two fixed armatures, as for example in the audio field.

Figure 12:
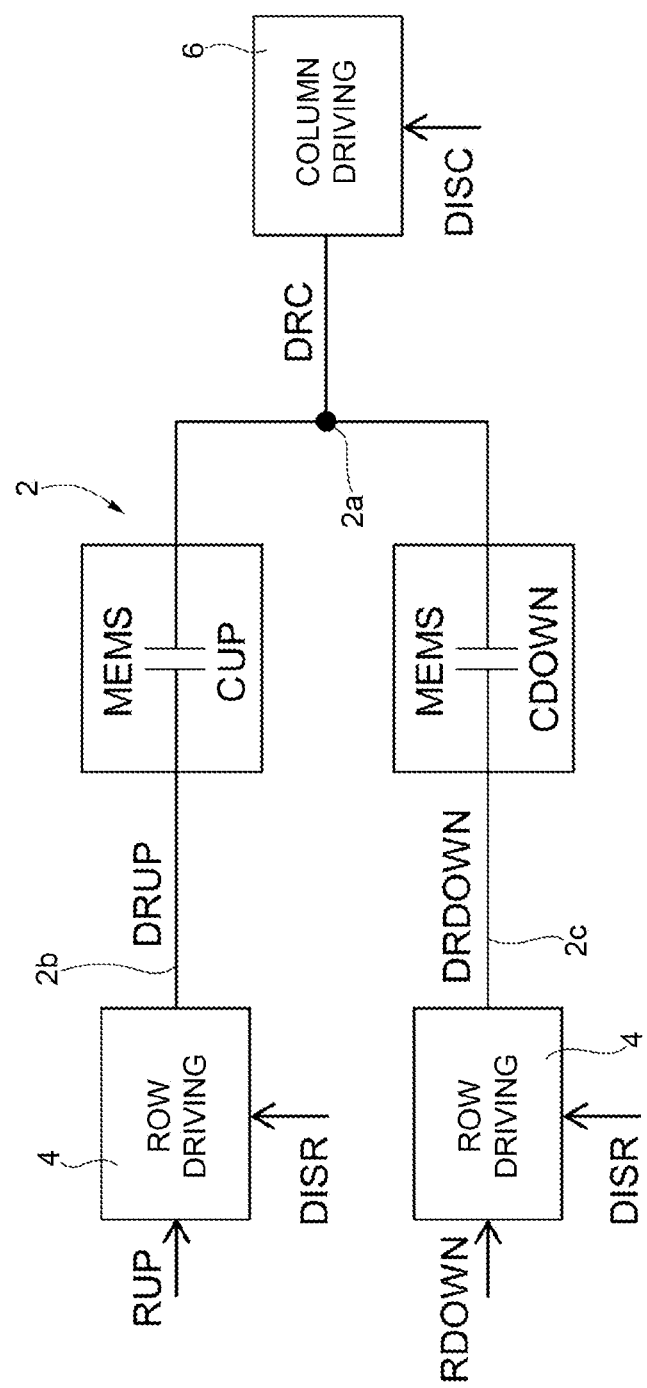
FIG. 12 shows a different configuration of a MEMS structure and of the associated driving system.

In the example illustrated in FIG. 12, the MEMS structure 2, once again designated by 2, has: a first terminal 2a associated to a corresponding membrane (here not illustrated) connected to a respective column driving stage 6; a second terminal 2b, associated to a first fixed armature (here not illustrated) connected to a respective first row driving stage 4; and a third terminal 2c, associated to a second fixed armature (not illustrated either), connected to a respective second row driving stage 4.

The first row driving stage 4 supplies a first row driving signal DRUP, as a function of a row-address signal RUP received at input; the second row driving stage 4 supplies a second row driving signal DRDOWN as a function of a row-address signal RDOWN received at input.

The MEMS structure 2 defines in this case a first capacitor CUP between the first and second terminals 2a, 2b and a second capacitor CDOWN between the first and third terminals 2a, 2c, having corresponding capacitive variations.

It is evident that what has been described previously with reference to the possibility of deactivation of the rows and/or columns identified as failed and with reference to detection and identification of the failures, finds similar application also in the MEMS structure 2 described with reference to FIG. 12.

In particular, in the case of identification of a failure associated to MEMS structure 2, the column and both of the rows corresponding to the same MEMS structure 2 will be disabled (by the row driving signals DRUP and DRDOWN).

Finally, it is emphasized that even though the solution has been described with reference to the more general case of a matrix array, it may advantageously be implemented also in the limit case of a vector array, possibly including just one MEMS structure 2 (in this case, possibly just one associated row and column driving stage may thus be present, as well as a corresponding redundancy structure).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
an array of MEMS structures arranged in rows and columns, each of the MEMS structures including a row terminal and a column terminal;
a plurality of column driving stages, each of the column driving stages being coupled to a respective column of the MEMS structures and including:
a column driving stage high-side transistor coupled between a first voltage and each of the column terminals of a respective column of the MEMS structures;
a column driving stage low-side transistor coupled between a second voltage and each of the column terminals of the respective column of the MEMS structures; and
a column driving stage control block configured to supply, based on a column-address signal, a first column control voltage to a control terminal of the column driving stage high-side transistor and a second column control voltage to a control terminal of the column driving stage low-side transistor, the column driving stage control block further configured to turn off the column driving stage high-side transistor and low-side transistor, based on a column-deactivation signal;
a plurality of failure detection stages coupled to the MEMS array and configured to detect a failure associated with one or more of said MEMS structures; and
a controller coupled to the plurality of failure detection stages and configured to identify a position of the detected failure, and to generate the column-deactivation signal based on the identified position of the detected failure.

2. The system of claim 1 wherein the column driving stage is configured to bring the column terminals of the respective column of the MEMS structures into a floating state based on the column-deactivation signal.

3. The system of claim 1, further comprising:
a plurality of row driving stages, each of the row driving stages being coupled to a respective row terminal of the MEMS structures and including:
a row driving stage high-side transistor coupled between a third voltage and each of the row terminals of a respective row of the MEMS structures;
a row driving stage low-side transistor coupled between a fourth voltage and each of the row terminals of the respective row of the MEMS structures; and
a row driving stage control block configured to supply, based on a row-address signal, a first row control voltage to a control terminal of the row driving stage high-side transistor and a second row control voltage to a control terminal of the row driving stage low-side transistor, the row driving stage control block further configured to turn off the row driving stage high-side transistor and low-side transistor, based on a row-deactivation signal.

4. The system of claim 1 wherein the MEMS array includes one or more redundancy columns, and the controller is configured to activate at least one of the redundancy columns upon turning off of a column driving stage high-side transistor and a column driving stage low-side transistor associated with the identified position of the detected failure.

5. The system of claim 1 wherein the controller, upon detection of a failure by one or more of the plurality of failure detection stages, is configured to identify the position of the detected failure by selectively activating the columns of the MEMS structures to identify a position of a column that causes passage of a failure current.

6. The system of claim 3 wherein the third voltage is greater than the second voltage, and the first and fourth voltages are greater than the second voltage and less than the third voltage.

7. The system of claim 5, wherein each of the failure detection stages includes:

a resistive element coupled to at least one of a respective high-voltage supply terminal or a respective low-voltage supply terminal, the resistive element configured to be traversed by the failure current; and a comparator coupled to the resistive element and configured to compare a detection voltage indicating a voltage across the resistive element with a threshold voltage.

8. A system, comprising:

an array of MEMS structures arranged in rows and columns, each of the MEMS structures including a row terminal and a column terminal; and a plurality of column driving stages, each of the column driving stages being coupled to a respective column of the MEMS structures and including:

a column driving stage high-side transistor coupled between a first voltage and each of the column terminals of a respective column of the MEMS structures;

a column driving stage low-side transistor coupled between a second voltage and each of the column terminals of the respective column of the MEMS structures;

a column driving stage control block configured to supply, based on a column-address signal, a first column control voltage to a control terminal of the column driving stage high-side transistor and a second column control voltage to a control terminal of the column driving stage low-side transistor, the column driving stage control block further configured to turn off the column driving stage high-side transistor and low-side transistor, based on a column-deactivation signal;

a first diode coupled between the column driving stage high-side transistor and the column terminals of the respective column of the MEMS structures; and a recirculation circuit branch including a second diode and a recirculation transistor coupled in series between the first voltage and the column terminals of the respective column of the MEMS structures.

9. The system of claim 8, each of the column driving stages further including a control circuit branch coupled between the column driving stage control block and a control terminal of the recirculation transistor, the control circuit branch including:

a voltage shifter configured to receive the first column control voltage and to generate a shifted voltage, based on the first column control voltage; and an inverter coupled between the voltage shifter and the control terminal of the recirculation transistor.

10. The system of claim 8, further comprising:

a plurality of failure detection stages coupled to the MEMS array and configured to detect a failure associated with one or more of said MEMS structures; and a controller coupled to the plurality of failure detection stages and configured to identify a position of the detected failure, and to generate the column-deactivation signal based on the identified position of the detected failure.

11. The system of claim 9, each of the column driving stages further including:

a first deactivation circuit branch including:

a first deactivation transistor having a first conduction terminal coupled to a third voltage; and a first deactivation diode having a cathode coupled to a second conduction terminal of the first deactivation transistor, and an anode coupled to the column terminals of the respective column of the MEMS structures; and a second deactivation circuit branch including:

a second deactivation transistor having a first conduction terminal coupled to the third voltage; and a second deactivation diode having an anode coupled to a second conduction terminal of the second deactivation transistor, and a cathode coupled to the column terminals of the respective column of the MEMS structures.

12. The system of claim 10 wherein the MEMS array includes one or more redundancy columns, and the controller is configured to activate at least one of the redundancy columns upon turning off of a column driving stage high-side transistor and a column driving stage low-side transistor associated with the identified position of the detected failure.

13. The system of claim 10 wherein the controller, upon detection of a failure by one or more of the plurality of failure detection stages, is configured to identify the position of the detected failure by selectively activating the columns of the MEMS structures to identify a position of a column that causes passage of a failure current.

14. The system of claim 11 wherein the first and second deactivation circuit branches are configured to force a voltage level at the column terminals of the respective column of the MEMS structures to the third voltage, based on the column-deactivation signal.

15. A column driving circuit for driving a column of MEMS structures, comprising:

a high-side transistor coupled between a first voltage and column terminals of each of the MEMS structures in the column;

a low-side transistor coupled between a second voltage and the column terminals of each of the MEMS structures in the column; and a controller configured to receive a column-address signal and to supply, based on the column-address signal, a first column control voltage to a control terminal of the high-side transistor and a second column control voltage to a control terminal of the low-side transistor, the controller further configured to receive a column-deactivation signal and to turn off the high-side transistor and the low-side transistor based on the column-deactivation signal;

a first diode coupled between the high-side transistor and the column terminals; and a recirculation circuit branch including a second diode and a recirculation transistor coupled in series between the first voltage and the column terminals.

16. The circuit of claim 15, further comprising a control circuit branch coupled between the controller and a control terminal of the recirculation transistor, the control circuit branch including:

a voltage shifter configured to receive the first column control voltage and to generate a shifted voltage, based on the first column control voltage; and an inverter coupled between the voltage shifter and the control terminal of the recirculation transistor.

17. The circuit of claim 16, further comprising:

a first deactivation circuit branch including:

a first deactivation transistor having a first conduction terminal coupled to a third voltage; and a first deactivation diode having a cathode coupled to a second conduction terminal of the first deactivation transistor, and an anode coupled to the column terminals; and a second deactivation circuit branch including:
    a second deactivation transistor having a first conduction terminal coupled to the third voltage; and
    a second deactivation diode having an anode coupled to a second conduction terminal of the second deactivation transistor, and a cathode coupled to the column terminals.

18. The circuit of claim 17 wherein the first and second deactivation circuit branches are configured to force a voltage level at the column terminals to the third voltage, based on the column-deactivation signal.

19. A method, comprising:
driving a plurality of MEMS structures, the MEMS structures being arranged in rows and columns, by:
    providing, by a column driving stage, a first column control voltage to a gate of a column driving stage high-side transistor, the column driving stage high-side transistor being coupled between a first voltage and column terminals of an associated column of the MEMS structures; and
    providing, by the column driving stage, a second column control voltage to a gate of a column driving stage low-side transistor, the column driving stage low-side transistor being coupled between a second voltage and the column terminals of the associated column of the MEMS structures;
detecting a failure associated with one or more of the MEMS structures in the associated column;
generating a column-deactivation signal based on the detected failure;
turning off the column driving stage high-side transistor and low-side transistor based on the column-deactivation signal; and
activating a redundancy column of the MEMS structures upon turning off of the column driving stage high-side transistor and low-side transistor.

20. The method of claim 19, further comprising:
driving the plurality of MEMS structures, by:
    providing, by a row driving stage, a first row control voltage to a gate of a row driving stage high-side transistor, the row driving stage high-side transistor being coupled between a third voltage and row terminals of an associated row of the MEMS structures; and
    providing, by the row driving stage, a second row control voltage to a gate of a row driving stage low-side transistor, the row driving stage low-side transistor being coupled between a fourth voltage and the row terminals of the associated row of the MEMS structures;
detecting a failure associated with one or more of the MEMS structures in the associated row;
generating a row-deactivation signal based on the detected failure; and
turning off the row driving stage high-side transistor and low-side transistor based on the row-deactivation signal.

* * * * *